United States Patent [19]

Chern et al.

[11] Patent Number: 5,007,690

[45] Date of Patent: Apr. 16, 1991

[54] HOLOGRAPHIC DATA STORAGE AND RETRIEVAL SYSTEM

[75] Inventors: Mao-Jin Chern, Rancho Palos Verdes; Ronald T. Smith, Redondo Beach, both of Calif.; Brent C. Frogget, Los Alamos, N. Mex.

[73] Assignee: Hughes Aircraft Company, Los Angeles, Calif.

[21] Appl. No.: 326,711

[22] Filed: Mar. 21, 1989

[51] Int. Cl.⁵ .......................... G02B 5/32; G11B 7/00; G11C 13/04

[52] U.S. Cl. .................................... 350/3.68; 369/103; 369/177; 365/125; 365/235

[58] Field of Search ................ 350/3.68, 3.6; 365/121, 365/125, 216, 235; 369/103, 177

[56] References Cited

U.S. PATENT DOCUMENTS

| | | |
|---|---|---|
| 3,572,881 | 3/1971 | Nishida ............................. 369/103 |
| 3,610,722 | 10/1971 | Bestenreiner et al. .............. 369/103 |
| 3,627,916 | 12/1971 | Bestenreiner et al. .............. 369/103 |
| 3,936,140 | 2/1976 | Ruell .................................... 369/103 |
| 4,025,731 | 5/1977 | Rembault ............................ 369/103 |
| 4,550,395 | 10/1985 | Carlson ............................... 369/103 |
| 4,849,912 | 7/1989 | Leberl et al. ......................... 382/41 |

*Primary Examiner*—Bruce Y. Arnold
*Assistant Examiner*—David R. Parsons
*Attorney, Agent, or Firm*—Leonard A. Alkov; W. K. Denson-Low

[57] ABSTRACT

A plurality of reflective diffusing holographic memory elements (16) is positioned on a memory plate (14). An array (24) of detectors (22) faces at least one of the memory elements. A laser (26) illuminates the selected memory element and the data stored therein is reflected onto the array for reading. A new memory element may be illuminated or may be brought into interrogation position.

4 Claims, 6 Drawing Sheets

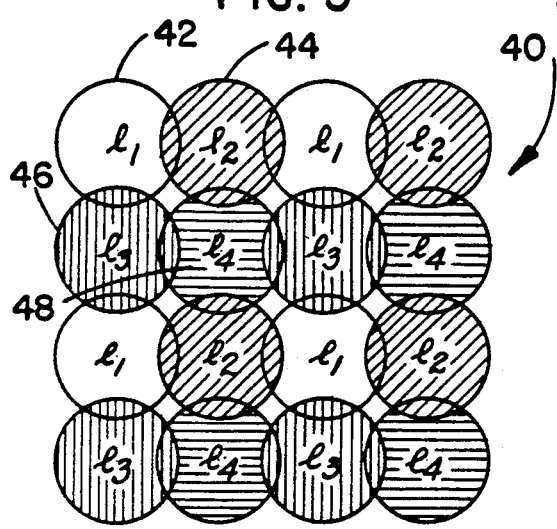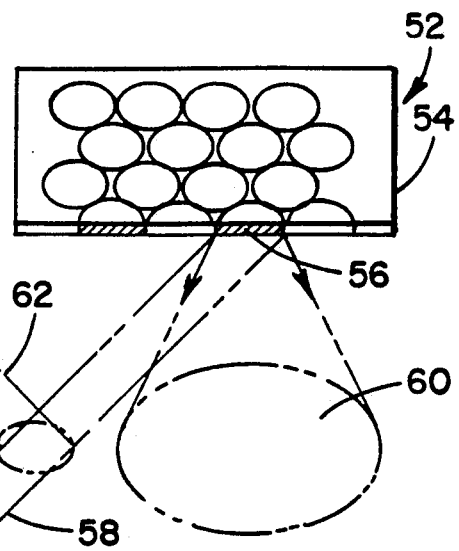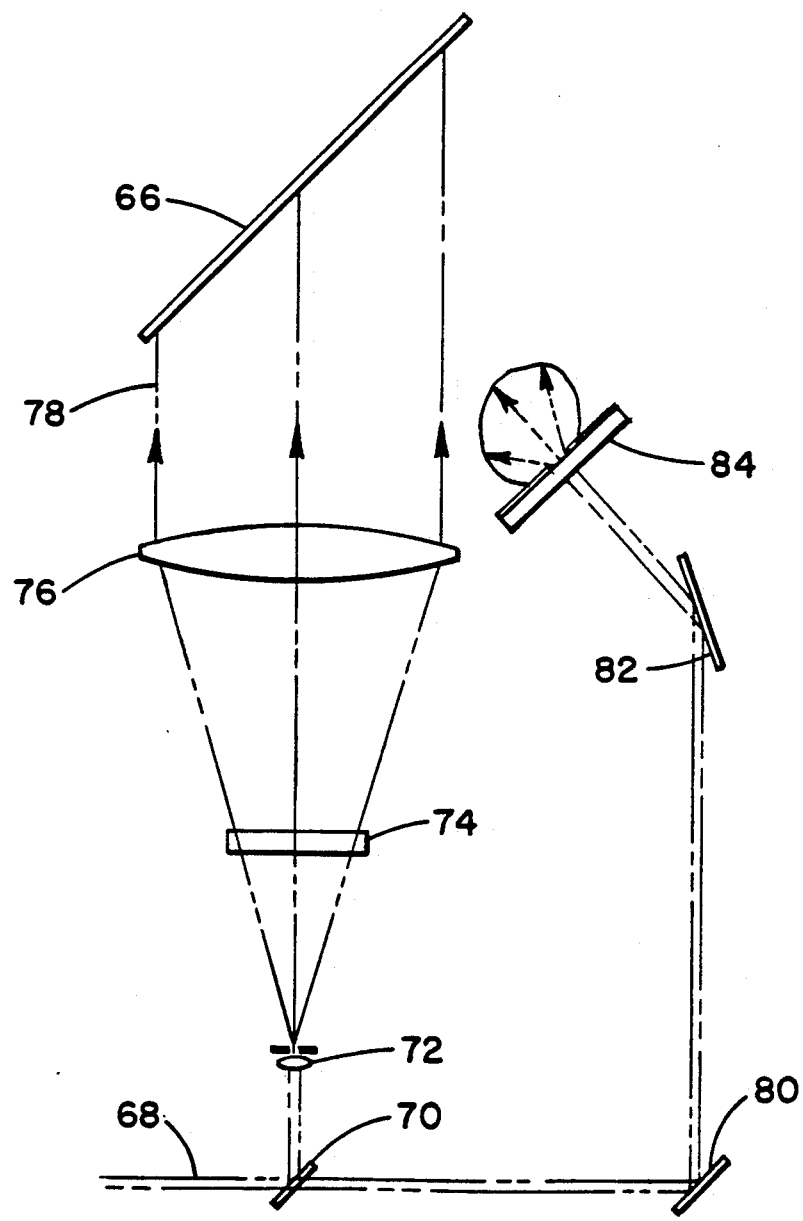

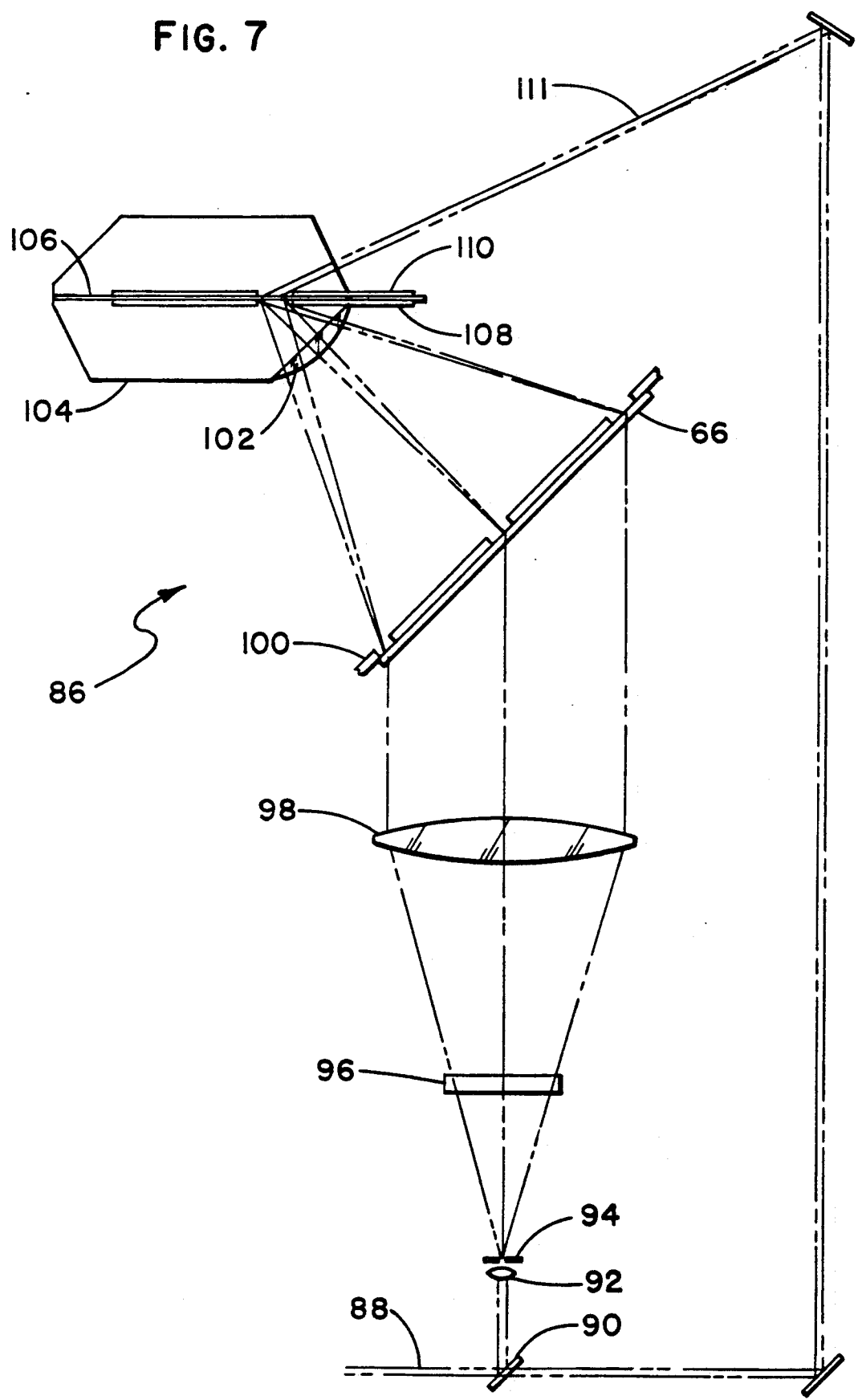

HOLOGRAPHIC DATA STORAGE AND RETRIEVAL SYSTEM

FIELD OF THE INVENTION

This invention is directed to a holographic data storage and retrieval system which utilizes a plurality of reflective diffusing holographic memory elements to store information in high information density together with structure which permits random access interrogation of the elements. The system provides highly reliable data information retrieval even in adverse environments and high density storage.

BACKGROUND OF THE INVENTION

Optical holographic data storage provides a high density fixed data base. One such system involves the storage and retrieval of data from a Fourier transform transmission hologram. Such a system uses a lens arrangement for data retrieval and requires considerable space. The use of a transmission hologram in a Fourier transform data storage system precludes the use of a double-sided holographic memory plate.

Another conventional holographic data storage system increases storage capacity by recording multiple holograms at different polarizations. In such a system, the retrieval or playback is at different polarization angles. Such a system is typically complex and bulky.

Another prior optical data storage system is commonly called the "optical disc". In such a system, the data is stored in binary form as a series of small holes. The presence of a hole is equivalent to a 1 state, and the absence of a hole is equivalent to 0 state. The hole is very small, in the order of 1 to 2 micrometers. During the retrieval process, the disc is rotated at high speed. The distance between the disc and detecting head is very small, typically 2 to 10 micrometers. The disc can store a large amount of data, but accurate playback is very susceptible to vibration and movement. With high density information, the optical disc system is not usable in a vibrating environment such as a vehicle.

Accordingly, there is a need for high-density data storage having physical relationships such that the structures are compact and simple so that they can be built to resist vibrational disturbance experienced in moving equipment such as aircraft. Data storage in a series of reflective holographic elements is a system which can meet the high density, small size, short data access time requirements and severe environmental conditions which can occur in aircraft, space and other uses.

SUMMARY OF THE INVENTION

In order to aid in the understanding of this invention, it can be stated in essentially summary form that it is directed to a holographic data storage and retrieval system wherein data is stored on a plurality of reflective holographic elements which face a plurality of optical detectors. Upon laser illumination of a holographic element, selected detectors are illuminated by the holographic reflection. The pattern of detector illumination comprises the output data. The optical detectors and laser may be selectively positioned with respect to any one of the reflective holographic elements.

It is, accordingly, a purpose and advantage of this invention to provide a high density information storage system wherein at least one reflective holographic element faces a plurality of optical detectors and, upon illumination of the holographic element, a pattern of the detectors is illuminated by reflection from a holographic element. By the employment of reflective diffusing recording and retrieval technology, a higher brightness data pattern is focused on the detector plane and there is no need for Fourier transform lenses. The absence of the lenses simplifies the retrieval optics and shortens the required distance between the holographic element and detector and has greater immunity to loss of data from dust by avoiding use of transfer lens elements.

It is another purpose and advantage of this invention to provide a holographic data storage and retrieval system which can employ a plurality of holographic elements close to each other with different wavelength response and arranged so that any one of the reflective holographic elements can be read at any time without interference from adjacent holographic elements so as to provide a large storage capacity in a compact and lightweight read-only memory system which has wide utility.

It is another purpose and advantage of this invention to provide a retrieval process whereby an optical reflective hologram reader is positioned adjacent a reflective holographic element in such a way that the system parts are close together and firmly supported so that the system has minimum dependence upon critical alignments whereupon it may be used in adverse environments.

It is another purpose and advantage of this invention to provide a high density reflective holographic data storage system which has no moving parts.

It is a further purpose and advantage of this invention to provide a holographic data storage and retrieval system wherein the member carrying the reflective holographic memory element can carry one on each face thereof so as to provide a double-sided system for ultra-high density data storage.

Other purposes and advantages of this invention will become apparent from a study of the following portion of the specification, the claims and the attached drawings.

BRIEF DESCRIPTION OF THE DRAWINGS

FIG. 5 is a pattern of reflective holographic memory elements showing that they can be closely spaced in overlapping relationship without signal overlap when each memory element is constructed to be illuminated with a laser of a different wavelength than its neighbors.

FIG. 6 is a perspective view of a plurality of reflective holographic memory elements on a carrying member therefor wherein the memory elements are separately illuminated at different wavelengths to create double storage at the same location.

FIG. 7 is a schematic side-elevational view of the optical system set up to record data on a reflective holographic optical element in accordance with data input.

FIG. 8 is a schematic side-elevational view of an optical system for exposure of the silver halide screen used in the exposure system of FIG. 7.

DESCRIPTION OF THE PREFERRED EMBODIMENTS

Figure 1:
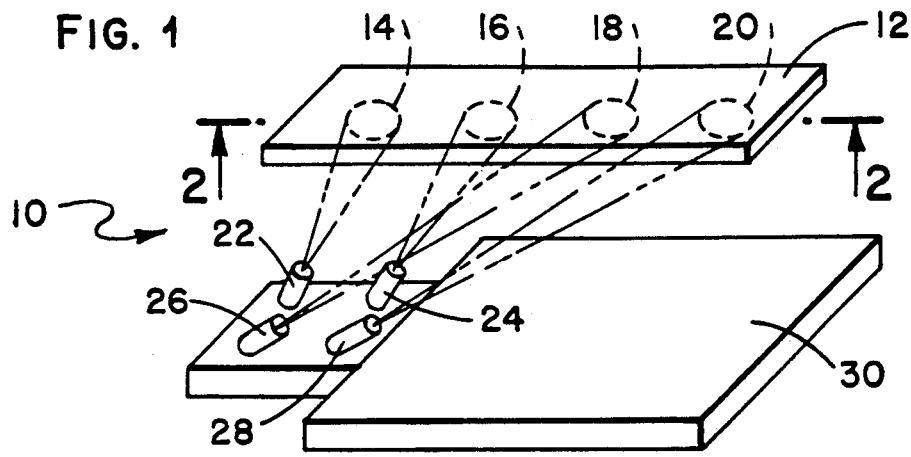
FIG. 1 is a perspective view of a preferred embodiment of a holographic data storage and retrieval system in accordance with this invention.
Figure 2:
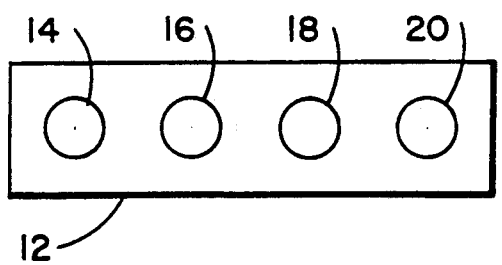
FIG. 2 is a view of several reflective holographic memory elements on a memory member for support thereof, as seen generally along the line 2—2 of FIG. 1.
Figure 3:
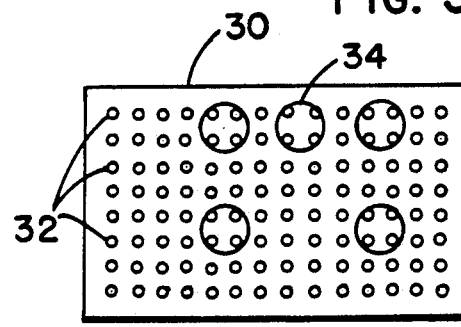
FIG. 3 is a plan view of the detector array, showing a plurality of detectors thereon.

FIGS. 1, 2 and 3 show a basic embodiment of a data storage and retrieval system 10 wherein a reflective diffusing holographic memory element is employed as the memory storage. Carrying member 12 is a support for a plurality of reflecting diffusing holographic memory elements. In the simplified version of the system, four memory elements 14, 16, 18 and 20 are shown in FIG. 1 as being mounted on the underside of the carrier. An illuminator is provided for each reflective diffusing holographic memory element. Illuminators 22, 24, 26 and 28 are respectively directed at the holographic memory elements 14-20. The illuminators are lasers which operate at the wavelength at which the memory information was recorded in the memory element associated therewith. Each illuminator thus produces a reading laser beam directed at its corresponding holographic memory element. Detector array 30 has a plurality of detectors on the surface thereof facing the holographic memory elements. As seen in FIG. 3, the detector array has a large number of detectors mounted on the surface facing the holographic memory elements. Several of these detectors are indicated at 32 in FIG. 3. A comparatively few detectors are illustrated for convenience. In actual use, the number of detectors in the array may be 200×200 detectors square, or larger. The detectors are sensitive to the wavelength of the laser illuminators employed.

When it is desired that a portion of the memory be interrogated, the chosen illuminator illuminates its corresponding reflective diffusing holographic memory element. The memory element is configured so that the incident radiation is reflected to energize those detectors to correspond to the stored memory. The memory element is interrogated and its stored memory illuminates selected detectors corresponding to the information in the memory. Thus the pattern of the detectors illuminated on the array corresponds to the information sought by interrogation. In FIG. 3, the circles thereon embracing several detectors, for example circle 34, represent an area energized by the reflection of illumination from the reflective diffusing holographic memory element. Several detectors are embraced by the illumination circle to illustrate that redundancy in the detectors can be achieved.

Figure 4:
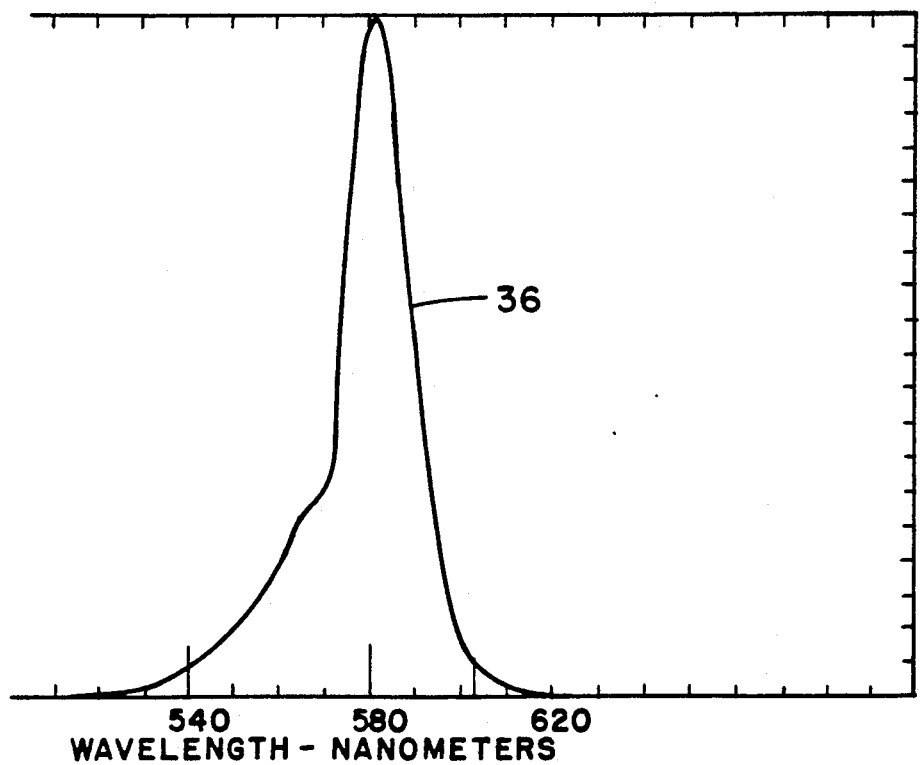
FIG. 4 is a graph showing amplitude versus wavelength of the spectral distribution of a played-back pattern from a reflective storage hologram memory element.

FIG. 4 is a graph showing the measured spectral response of a typical reflective diffusing holographic memory element. The spectral response curve 36 is plotted against the wavelength in nanometers on the abscissa, and the ordinate is relative with a peak of the curve at 100 percent. This graph shows that the response peak is sharp, and below 5 percent response, the base of the curve is narrow. From the peak point at 580 nanometers, the response drops off to 5 percent in about 22 nanometers, and on the shorter wavelength side it drops off to 5 percent in 40 nanometers. Thus, there is considerable separation between response and nonresponse. This sharp, narrow response curve permits reliable sensing of the reflected illumination striking the detector array.

When they are illuminated by a laser of the same frequency, the memory elements must be spaced sufficiently far apart so that when one is illuminated, the adjacent memory elements are not sufficiently illuminated to provide spurious signals to the detector array. The physical separation of the reflective holographic memory elements is shown in FIG. 1. The greater separation is desired so that precision and accuracy requirements of the detector array and reflective diffusing holographic memory element can be reduced and reliability of retrieval is improved. However, using large physical separation between the holographic memory elements, the smaller the amount of data that can be stored in a given plate area. That is, the density is reduced.

To improve the storage density and maintain the readout accuracy, FIG. 5 illustrates a storage configuration which utilizes the wavelength selective characteristics of the reflective diffusing holographic memory element employed in the memory system. A set of memory elements is illustrated in plan view in FIG. 5 and is generally indicated at 40. The set 40 is comprised of groups of four memory elements, arranged with each memory element in the set sensitive to a different laser wavelength $l_1$, $l_2$, $l_3$ and $l_4$. The wavelengths are sufficiently separate so that the holographic element, even when illuminated by the different laser wavelengths, does not generate enough spurious signal to affect the desired data reading. Thus, memory elements 42, 44, 46 and 48 are each a reflective holographic memory element, and each is recorded so that it is sensitive to a different laser wavelength.

Memory elements sensitive to the same wavelength are spaced apart by elements sensitive to other laser wavelengths so that when illuminated by a particular wavelength, there are no adjacent memory elements reflectively responsive to the same laser wavelength. This provides the spacing to eliminate crosstalk and thereby reduce accuracy requirements, but maintains high density information storage. In such a system, the reader has four lasers at the selected wavelengths appropriate to illuminate the respective memory elements of a set.

One example is the provision of laser diodes with wavelengths of 780, 720, 680, and 640 nanometer wavelength, so that each has a 60 nanometer separation. This separation and the narrow-peak response illustrated in FIG. 4 provides a system wherein the spurious signal produced by overlap of the illumination onto an adjacent memory element is at least a factor of 20 lower than the true data signals. This greatly increases storage capacity as well as readout speed in those structures described below wherein memory elements are moved into reading position in front of the illuminators and detectors, because four holographic memory elements can be read with only one relative movement between the detector and the memory element.

In addition, it is possible to further increase the storage capacity by superimposing two or more reflective holographic memory elements on the same location, each of which responds to a different wavelength, see FIG. 6. With such superposition, it is essential wavelengths be sufficiently apart that the reflective response for each hologram element within the spot does not overlap the reflective responses in the one or more superimposed hologram memory elements and the adjacent elements. Testing has shown that for typical superimposed reflective holographic memory elements, about 40 nanometer wavelength separation is needed between hologram memory elements to avoid crosstalk.

FIG. 6 shows a system 52 wherein a memory carrying member 54 has a plurality of memory elements thereon. Memory element 56 is the one to be noted with respect to this description. Memory element 56 is illuminated by laser light at a wavelength $l_3$. The beam 58 at wavelength $l_3$ is directed onto the memory element 56 and, depending upon the reflective characteristics of the memory element at that frequency, directs energy selectively over detectors positioned in beam footprint 60. Thus, when illuminated with beam 58, selected detectors within the footprint 60 are illuminated. However, the memory element 56 can alternatively be read by beam 62 at wavelength 11. Beam splitter 64 is on the path of both beams 58 and 62 and directs beam 62 to illuminate memory element 56. From this source of illumination, detector elements within the footprint 60 are selectively illuminated, depending upon the reflective characteristics stored within the memory element as the memory thereof.

A multi-wavelength memory system, whether with adjacent memory elements, as in FIG. 5, or superimposed memory elements, as in FIG. 6, provides a very high storage density because the wavelength separation permits close positioning of memory elements sensitive to different wavelengths. This wavelength separation reduces the crosstalk and thus improves the reliability and accuracy of the memory system.

FIG. 8 is an exposure system for exposing a silver halide screen 66 for use in the memory element exposure system. Exposure beam 68 is a collimated laser beam at a frequency to which the unexposed silver halide screen 66 is sensitive. Beam splitter 70 delivers part of the beam through convex lens 72, which produces a divergent beam. Gaussian apodizer 74 is positioned on the divergent beam path. Beyond the apodizer, collimating lens 76 produces a broad beam 78 directed to the screen 66. The screen 66 is set at about 45 degrees to the central array of collimated broad beam 78. That portion of the exposure beam 68 which passes through beam splitter 70 is reflected off of mirrors 80 and 82 to flashed opal 84. The flashed opal is on a line substantially normal to the center of screen 66 and produces a diffuse beam with a spherical wave front. The result is an exposure of the silver halide screen as having an interference pattern of the two beams which result in concentric circular rings.

After the exposure, screen 66 is developed and used in the memory element exposure system 86 of FIG. 7. The exposure system is the preferred system for exposing reflective diffusing holographic memory elements as employed in the storage and retrieval system of this invention. Laser beam 88 partially reflects off of beam splitter 90 which delivers a portion of the original exposing laser beam through convex lens 92 which has an aperture plate 94 along the beam center line to strip the edges off of the now divergent beam. The divergent beam passes through Gaussian apodizer 96 and through convex lens 98 to produce a broad collimated beam which is directed over the silver halide screen 66. The silver halide screen lies at about a 45 degree angle to the center line of the beam from aperture plate 94 through convex lens 98. Page composer 100 lies against the screen 96. The page composer defines those portions of the detector array which are to be illuminated and may be an opaque sheet with openings appropriately located thereon. Such is slow, however, and the page composer is preferably a device which can be computer-driven such as a transmissive liquid crystal matrix display. The optical character of the silver halide screen 66 is such as to focus the beam towards lens 102 which is formed as part of prism 104. The result is to focus the energy on the holographic film 106 which is preferably a dichromated gelatin film. A dichromated gelatin film is the most attractive recording medium for data storage holograms because of the typically high diffraction efficiency and signal-to-noise ratios available. However, most laser diodes, which typically supply the playback beam, operate between 800 and 1,000 nanometers. In order to play back the holographic memory elements in the preferred on-axis or close to on-axis configuration, the exposure beams must be predistorted and highly off-axis, as shown in FIG. 7.

Shutters 108 and 110 have apertures therein to limit the area of the film 106 which is to be exposed to define a memory element. The reference portion of the beam 88 which passes straight through beam splitter 90 is reflected off of mirrors to form a beam 111 which is a collimated plane wave which interferes with the exposure beam to produce an exposure of the memory element at that location in the holographic film. After every exposure, the film 106 is moved to a new location to expose a new memory element in the apertures of the shutters, and the page composer 100 is reconfigured to expose those portions which define the new data to be recorded. In recording multiple reflective diffusing holographic memory elements on the dichromated gelatin plate, each element is recorded with the beams in slightly different orientation with respect to the plate in order to achieve different wavelength sensitivities of the memory elements during playback.

Figure 10:
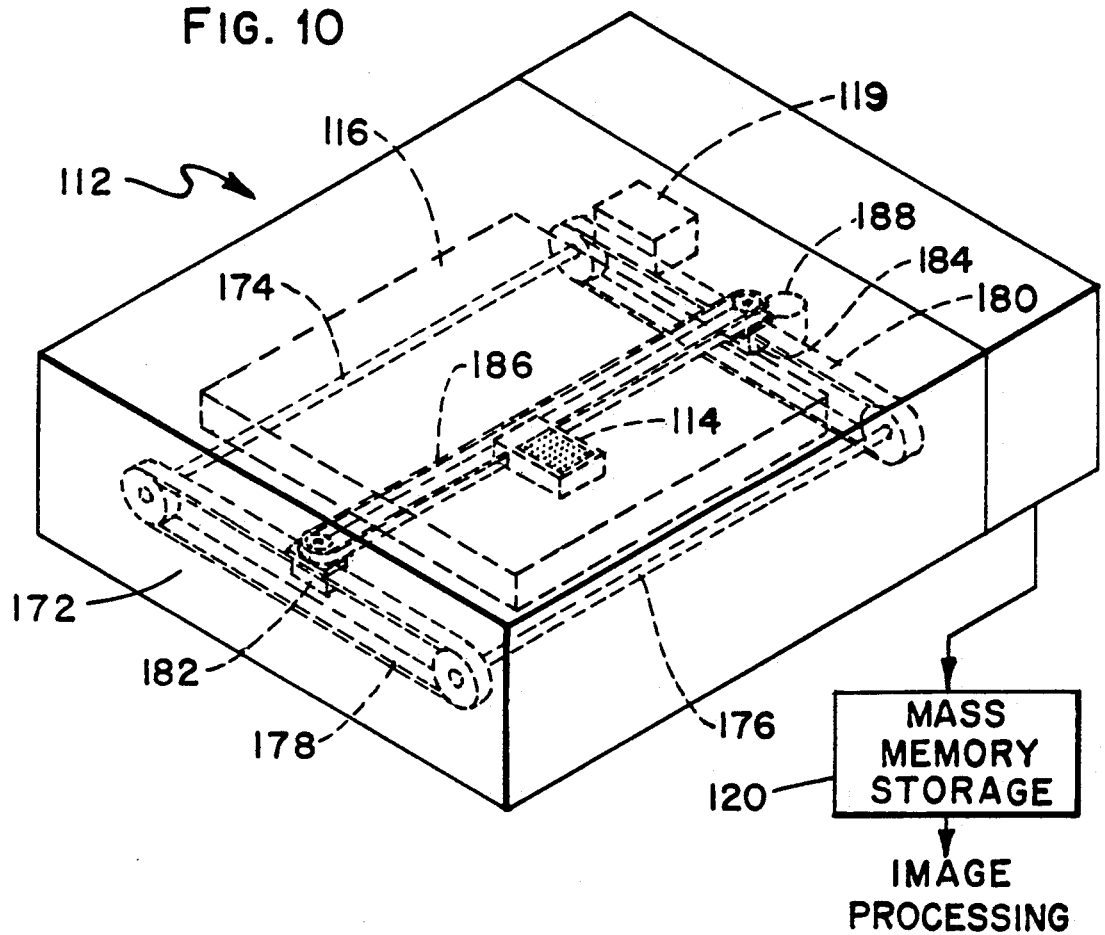
FIG. 10 is an isometric view of another preferred embodiment of a holographic data storage and retrieval system embodying the principles of FIG. 9 in accordance with this invention.
Figure 9:
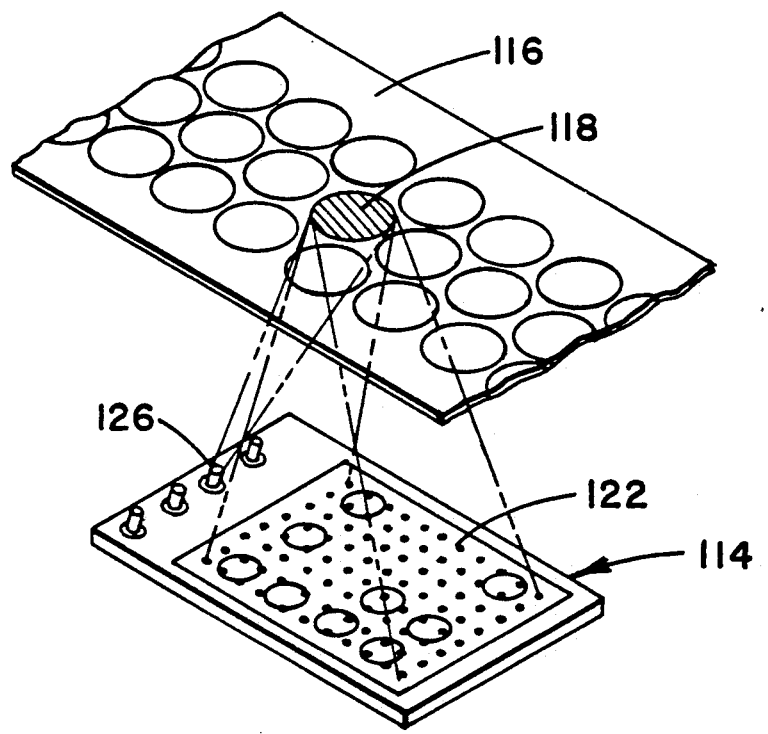
FIG. 9 is another preferred embodiment of a reflective holographic data storage and retrieval system of this invention wherein the detector element and illuminator source are movable with respect to the holographic memory elements and can arrange different selected memory elements into reading relationships therewith.

FIG. 10 shows a preferred embodiment of a holographic data storage and retrieval system wherein the illuminating beam and detector array are movable with respect to plural memory elements. The system is generally indicated at 112. The system 112 has an optical reflective hologram reader 114 facing upward and positioned in parallel closely spaced relationship to a fixed holographic memory plate 116, which has a plurality of individual reflective holographic memory elements thereon. One of the memory elements is indicated at 118 in FIG. 9. It is also seen in FIG. 9 that the memory elements are arranged on the face of plate 116, facing the reader 114. The memory elements are recorded and arranged so that the adjacent elements may be sensitive to different wavelength as was described with respect to FIG. 5. The transport system shown in dashed lines in FIG. 10 represents means by which the reader 114 is transported with respect to the memory plate 116 to read the selected one particular holographic memory element thereon. The transport system includes controller 119 which controls motors for moving reader 114 in the upper left to lower right direction in FIG. 10 and for controlling motors which moves the reader 114 in the lower left to upper right direction in FIG. 10, as described in more detail below. By this means, reader 114 can be positioned in reading relationship to any one of the memory elements to be read. The output from the reader goes to memory 120 which provides the immediate access memory for supplying further processing. When the memory information relates to images, the next step is image processing as indicated in FIG. 10.

In FIG. 9 we see reader 114 as being formed of a plurality of detectors, generally indicated at 122. The number of detectors is a function of the discrete data elements which can be recorded upon the memory element 118. As an example, memory element 118 is one millimeter in diameter. When played back into an f/1 optical system, it can store more than $10^6$ bits per square millimeter. Thus, each one millimeter circular element can store sufficient information to require a square detector array to be at least 1,000×1,000 detectors. Preferably, 3,000×3,000 detectors for better reading accuracy are provided. With a smaller array, memory elements of smaller size than 1 millimeter discs may be used and accordingly placed closer together.

Reading of the reflective hologram memory element 118 requires illumination by a laser such as compact, lightweight diode lasers. Laser 126 is preferably mounted on reader 114. The laser is directed to illuminate memory element 118 so that the reflections representing data stored in the element 118 are directed to the detectors in the array. The memory element 118 has recorded therein information so that a plurality of selected detectors 122 in the array 114 are illuminated. The circles on the array in FIG. 9 illustrate a particular holographic image pattern of the holographically reflected light. To address holographic elements which are sensitive to different wavelength, multiple laser sources with corresponding wavelength output are mounted on the reader and directed toward the corresponding elements, as illustrated in FIG. 9.

In order to multiply the available memory it is only necessary to move detector array 122 with respect to memory plate 116 in order to interrogate a different memory element. In FIGS. 9 and 10, the relative movement between the memory plate 116 and detector array 122 is accomplished by rectangular relative movement When memory plate 116 is large and there is a large number of memory elements 118 thereon, it is convenient to secure the memory plate 116 in a fixed location and move the reader 114 with respect to the memory plate 116. As previously described, an x-y drive 119 moves the reader 114 and array 122 under the memory plate 116. With a proper drive, movement of the array 122 from one memory element 118 to another can be accomplished in 100 milliseconds. One of the advantages of this system is that the size of the memory plate can be quite large and store a considerable amount of information. Such a storage system is capable of storing 1,500 megabits of information. In this embodiment, the memory elements are spaced sufficiently far apart to eliminate crosstalk which might occur when the laser 126 illuminates the edge of an adjacent memory element 118.

The structure of FIG. 10 is an example of how a firm, accurate and repeatable system can be achieved. The memory plate 116 is fixed in housing 172. Housing 172 carries cross moving shafts 186 and 188 rotatably mounted therein. These cross shafts each have a fixed wheel on the end, and tapes 178 and 180 engage around those wheels. Thus, both shafts rotate together. A motor in controller 119 rotates those shafts and the controller reads their position. Carriages 182 and 184 are clamped to one stand of the tapes 178 and 180, respectively, so that they move in the same direction when the tapes are moved. Each of the carriages has an upright shaft, with a wheel thereon. Tape 186 engages over these wheels and is moved on the wheels by means of motor 188 energized by the controller. Reader 114 is clamped to one of the stands of tape 186 so that the reader can be moved in either or both the orthogonal directions defined by the motion of the shafts. Such a device is compact, of light weight, and provides repeatable positioning of the reader.

Figure 12:
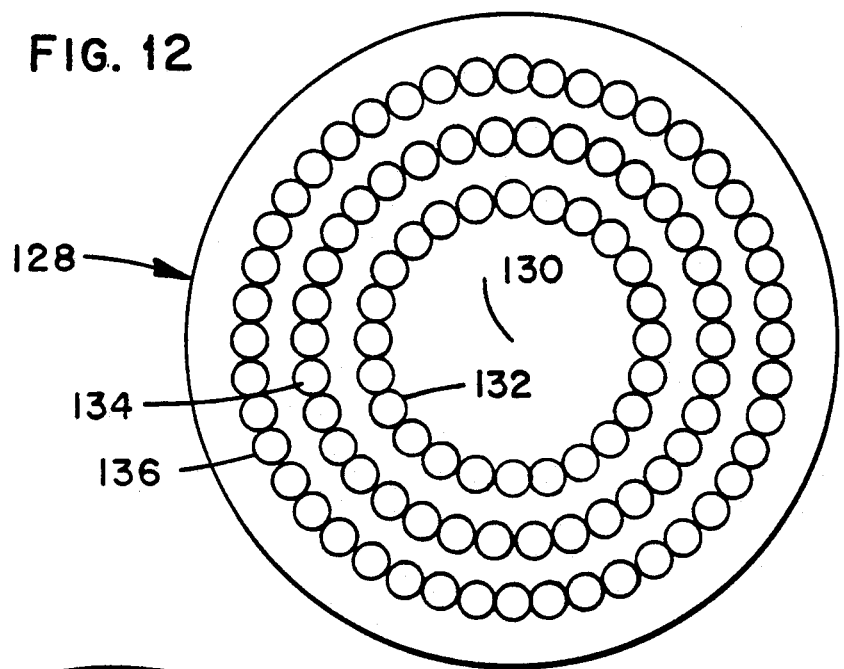
FIG. 12 is a plan view of a disc with a plurality of reflective holographic memory elements thereon, showing a second manner in which the memory elements are positioned for being moved into place with respect to a reader.
Figure 13:
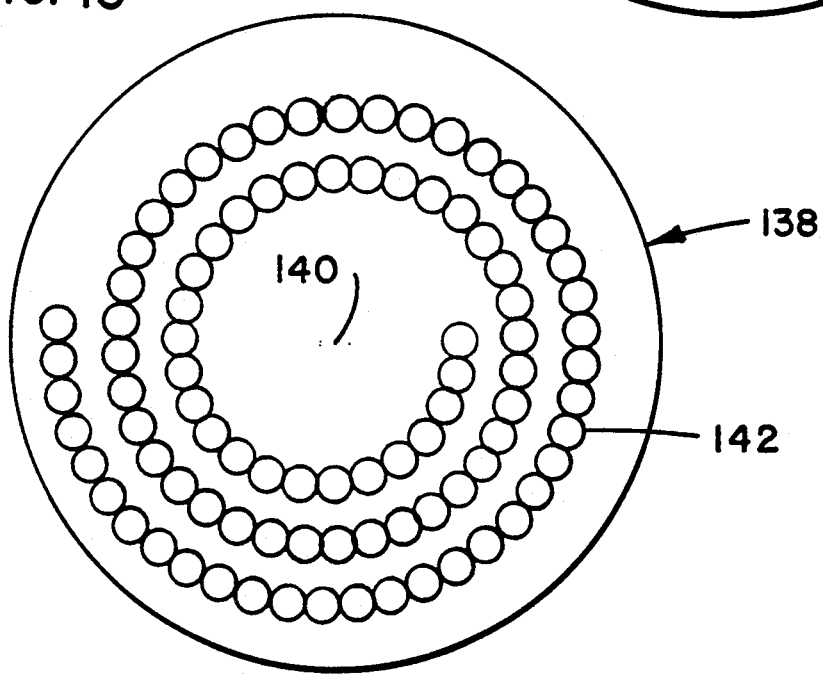
FIG. 13 is similar to FIG. 12, showing a disc with a plurality of reflective holographic memory elements thereon, showing the third preferred embodiment of the way of positioning a holographic memory element with respect to a reader.

In the embodiment of FIG. 12, memory plate 128 is a circular plate mounted for rotation about its central axis 130. Memory plate 128 carries memory elements disposed in concentric rings. Three concentric rings 132, 134 and 136 are illustrated. In the system in which the memory plate 128 is used, the memory plate carries reflective holographic memory elements on one or both sides thereof and can be rotated on its axis to a selected position A reader 114 such as that with detector array 122 is positioned adjacent one side of the plate 128 which has the rings of memory elements 118 thereon. The reader is arranged to move radially with respect to the axis. Radial movement of the reader with its detector array and rotary movement of the memory plate 128 bring the selected memory element 118 into reading position with respect to the detector array on the reader. In the same way as illustrated in FIGS. 1 and 9, one memory element at a time is addressed by a laser diode beam, and the data stored in the reflective holographic optical element is projected onto the solid state detector array 122. Similarly to the structure of FIG. 9, the translation of the reader from one ring of memory elements to the next requires about 100 milliseconds in time, while disc rotation requires only 10 milliseconds from one memory element to the next around the ring of elements. Another way to reduce the access time is by use of memory plate 138, as shown in FIG. 13, and associated reading structure. Memory plate 138 rotates about an axis 140 and carries a series of reflective holographic memory elements 142 in spiral pattern around the axis. The spiral pattern on the storage disc requires only slight radial relative motion of the reader with respect to the addressed memory element as the disc is rotated from one memory element to the next. In this way, address time is reduced to 10 milliseconds due to the short radial traverse required of the reader.

When considering the question of the maximum data storage, it is noted that by making each holographic memory element smaller, a larger number of such memory elements can be placed on the memory plate. However, increased diffraction caused by decreasing the memory element diameter reduces the number of resolvable image bits in a given solid angle. On first order analysis, these two effects cancel and the information storage capacity is independent of memory element diameter and is dependent only on the playback wavelength and the f-number of the system.

Figure 11:
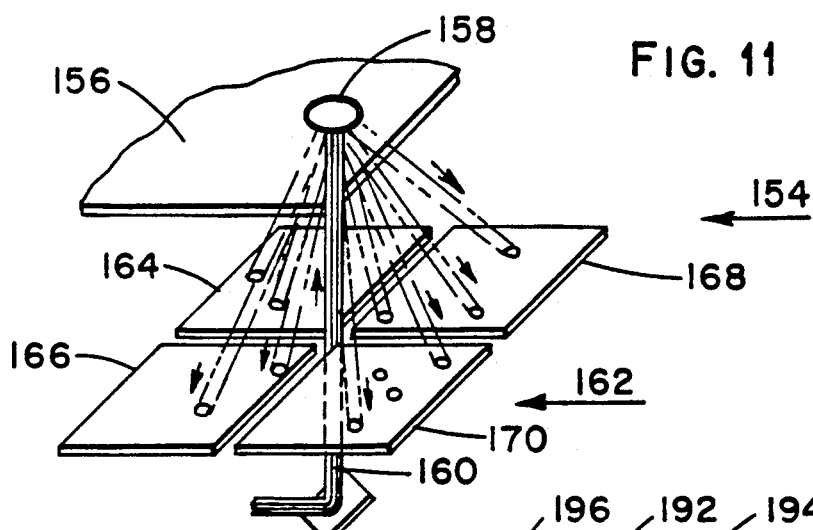
FIG. 11 is another preferred embodiment of optical reflective hologram reader, for reading the reflective holographic memory elements positioned thereacross.

As an alternative to the optical reflective holographic readers shown in FIGS. 1 and 9, the reader 54 shown in FIG. 11 allows the use of a smaller f number. The memory plate 156 has a plurality of reflective holographic memory elements on the underside thereof, such as the one shown at 158. It is understood that the plurality of such memory elements, such as element 158, can be moved with respect to the reader 154, in similar manner to that shown in FIGS. 9, 10, 12, and 13. The illuminating laser beam 160 is directed up through an opening in or between sections of optical reader 162. Optical reader 162 is comprised of four sections 164, 166, 168 and 170 which each carry thereon a plurality of sensing areas in accordance with the principles discussed with respect to FIG. 9. The optical reader 162 comprises four quadrants of charge-coupled device sensor arrays and the four quadrants are placed symmetrically around the energizing laser beam. On playback, the diffracted beam diverges symmetrically from the hologram with respect to the incident beam 160. Therefore, the maximum angles between the incident and playback rays are half as large as in the configuration shown in FIG. 9, resulting in reduced dispersion and higher resolution. Consequently, a smaller f number system and a greater detector array size is possible than in the configuration of FIG. 9.

In order to have a reliable system, it is necessary to be able to reliably readdress each selected holographic memory element. In adverse environments of vibration and external forces, such is more difficult. It is easier to accomplish such recall when the memory plate is held in a rigid position, as indicated in FIG. 10, as compared to moving the memory plate past a reader which is in a fixed position, as indicated in FIGS. 12 and 13.

Figure 14:
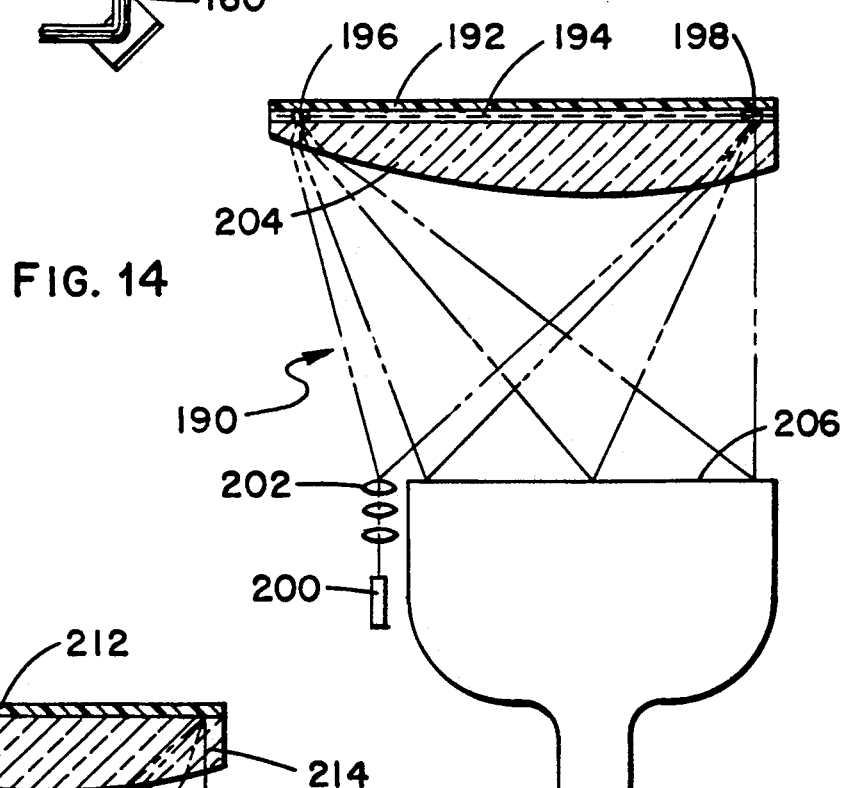
FIG. 14 is a side-elevational view, with parts broken away and parts taken in section, of an embodiment of the data storage and retrieval system wherein the reader does not move with respect to the plurality of holographic memory elements, but a liquid crystal light valve provides reading windows for reading particular selected holographic memory elements.
Figure 15:
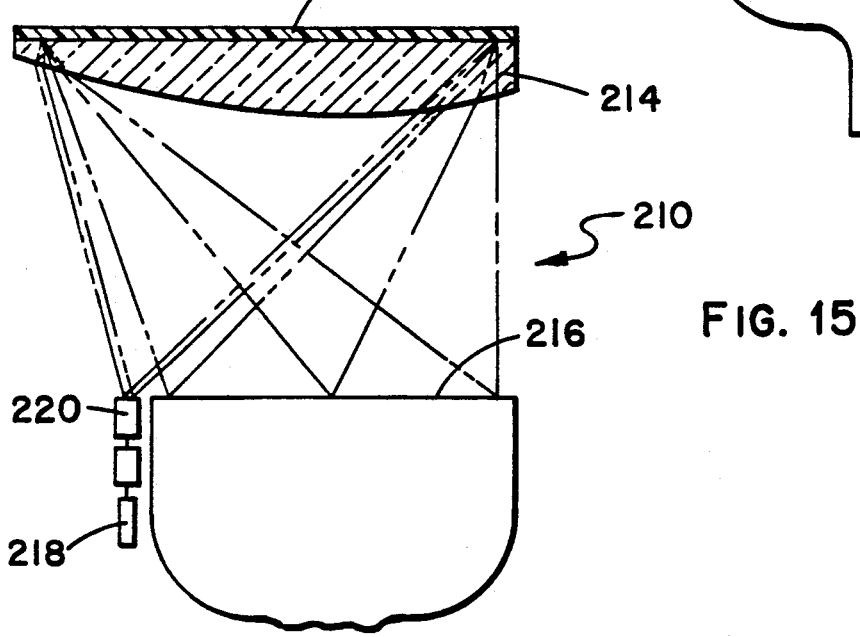
FIG. 15 is similar to FIG. 14 wherein all of the holographic memory elements are visible to the reader, but the reading laser beam is directed to a particular selected holographic memory element at one time.

System 190, shown in FIG. 14, does not use moving parts. A memory plate 192 has a plurality of reflective holographic memory elements thereon, as previously described. Liquid crystal light valve 194 can be energized to open windows in front of the memory element selected to be read. In FIG. 14, two windows 196 and 198 are illustrated. In normal use, only one such window would be transparent at a time. The fact that two are shown in FIG. 14 is for the purpose of illustrating the width of the laser flood beam. Laser 200 directs its energy through optical system 202, which provides a broad beam to illuminate the entire face of the active portion of the memory plate and the liquid crystal light valve which covers it. Field lens 204 is in direct physical contact with the liquid crystal light valve 194. The field lens refracts the incident beam into the desired direction and focuses the diffracted reflected light down to the detector array 206. The array reads the spots which are energized by the information data recorded in the reflective holographic memory element. In FIGS. 14 and 15, the detector array is in the form of a cathode ray tube. Its face is scanned, and when a pixel is illumined by reflection from a memory element, a signal is produced. The light valve must have a double-pass contrast ratio sufficiently great so that light leaking through from the other, presumably non-illuminated, holographic memory elements will not obscure the data presented by the element which is illuminated through the open light valve window. In addition, the light power of the laser must be sufficiently large to compensate for the fact that the entire face of the liquid crystal light valve must be illuminated, while the only effective illumination is that directed to the portions of the liquid crystal light valve which present an open window to the reflective holographic memory element which is to be interrogated.

The system 210 illustrated in FIG. 15 is a similar structure to the system shown in FIG. 7. Memory plate 212 has a plurality of reflective holographic memory elements thereon, the same as memory plate 192. Field lens 214 lies directly against the memory elements on memory plate 212. Detector array 216 faces the field lens and memory plate. Laser 218 is directed generally toward the memory plate, and forward of the laser is scanner 220 which deflects the laser beam to selectively direct it to an address location on the memory plate. The laser beam deflector can be an acousto-optic scanner or may be another type of scanner, such as a lens or mirror deflection system. By the use of the field lens 214 on the front of the memory plate 212, the reading beam internal incident angle as it addresses the memory plate at any location is the same for every reflective holographic memory element on the memory plate. This allows the use of a relatively simple exposure system which does not need to accommodate differences in angle of the interrogation beam. Furthermore, by employment of the field lens 214, the storage capacity of the memory plate 212 is not limited at its edges due to highly off-axis recording and interrogation. Geometric aberrations generated by the field lens 214 do place a limitation on the size of the memory plate 212, and consequently on the storage capacity of the system, but this is less of a limitation than the angular interrogation beam which would need to be used in the absence of the field lens. Both configurations in FIGS. 14 and 15 incorporate a field lens in physical contact with the storage plate. The lens refracts the incident beam into a desired direction and focuses the diffracted light down to the detector array.

By use of the field lens, the playback beam configuration internal to the storage disc is identical for every subhologram, and allows the use of a relatively simple exposure system illustrated in FIG. 7, but without the field lens. Without the field lens in the exposure and playback setup, each hologram would have a different playback configuration, and this would greatly complicate the exposure setup. In addition, the diameter of the storage disc and the storage capacity would be severely limited because of the unacceptable performance of highly off-axis storage holograms. Geometric aberrations generated by the field lens do place a lesser limitation on the diameter of the storage disc and the storage capacity of the system.

Some of the significant advantages of using a reflective diffusing holographic memory element for recording and data retrieval is that the Fourier transfer lens is not required to process the holographic output, but the data can be read directly on a detector array. Without the Fourier transfer lens between the holographic record and the array, they can be located closely together. This in turn improves the illumination of the selected detectors in the array to improve reliability. The use of a Fourier transfer lens also raises the problem of dust on the lens, which causes data reading errors and consequent unreliability. Another advantage of using the reflective diffraction hologram is that a two-sided system can be created. The two-sided system is especially advantageous where the memory plate is moved with respect to the reader because double storage capacity can be achieved with only one moving and positioning structure.

Mechanical scanning achieves stable and reliable readout because of the short distance between the memory element and the detector array which results from employing a reflective diffusing hologram as the memory element. The employment of mechanical scan can achieve stable and reliable readout because of the short distances involved between the reflective diffusing holographic memory element and the reader. Furthermore, since the memory element is reflective, a double-sided structure can be created so that double the memory can be obtained with the same positioning structure.

This invention has been described in its presently contemplated best mode, and it clear that it is susceptible to numerous modifications, modes and embodiments within the ability of those skilled in the art and without the exercise of the inventive faculty. Accordingly, the scope of this invention is defined by the scope of the following claims.

What is claimed is:

1. A holographic data storage and retrieval system comprising:
    a plurality of reflective diffusing holographic memory elements having holographically stored therein data to be read;
    a laser positioned to illuminate said reflective diffusing holographic memory elements;
    a detector array positioned to be illuminated by laser light reflected by said reflective diffusing holographic memory elements, said detector array having a plurality of detectors thereon so that at least one of said detectors is illuminated to correspond to data information stored in said memory elements, and said detector array is moveable with respect to said plurality of reflective holographic memory elements so that one of said memory elements can be positioned with respect to said array to be illuminated by said laser and reflect to said array;
    means for selecting which of said reflective holographic memory elements will reflect laser light to said detector array;
    a memory plate is fixed in position and said detector array is movable with respect to said memory plate so as to permit movement of said detector array to a selected position with respect to said memory plate to read the reflections from said laser off of said selected memory element; and
    an optical reflective holographic reader wherein said detector array and said laser are both mounted on said reader and said reader is movable with respect to said memory plate wherein said reader faces said memory plate and said reader is movable on rectangular axes with respect to said memory plate and said plurality of memory elements on said memory plate is arranged in a rectangular pattern.

2. The system of claim 1 wherein said plurality of memory elements faces said detector array and there is a plurality of lasers directed to illuminate at least a selected memory element, each of said plurality of lasers operating on a different wavelength, said memory elements being configured to reflect data to said detector array at different wavelengths.

3. The system of claim 2 wherein adjacent memory elements reflect data onto said detector array when illuminated by light of different wavelengths to prevent signals from said adjacent memory elements from reaching said array.

4. The system of claim 1 wherein said plurality of memory elements faces said detector array and there is a plurality of lasers directed to illuminate at least a selected memory element, each of said plurality of lasers operating on a different wavelength, said memory elements being configured to reflect data to said detector array at different wavelengths.

* * * * *